United States Patent
Adams et al.

(10) Patent No.: US 7,714,318 B2
(45) Date of Patent: May 11, 2010

(54) ELECTRONIC DEVICE INCLUDING A TRANSISTOR STRUCTURE HAVING AN ACTIVE REGION ADJACENT TO A STRESSOR LAYER

(75) Inventors: Vance H. Adams, Austin, TX (US); Paul A. Grudowski, Austin, TX (US); Venkat R. Kolagunta, Austin, TX (US); Brian A. Winstead, Austin, TX (US)

(73) Assignee: Freescale Semiconductor, Inc, Austin, TX (US)

( * ) Notice: Subject to any disclaimer, the term of this patent is extended or adjusted under 35 U.S.C. 154(b) by 0 days.

(21) Appl. No.: 12/180,818

(22) Filed: Jul. 28, 2008

(65) Prior Publication Data
US 2008/0296633 A1 Dec. 4, 2008

Related U.S. Application Data

(62) Division of application No. 11/269,303, filed on Nov. 8, 2005, now Pat. No. 7,420,202.

(51) Int. Cl.
*H01L 29/06* (2006.01)
(52) U.S. Cl. .......................... 257/18; 257/20; 257/190; 257/505; 257/507; 257/509; 257/524
(58) Field of Classification Search .................... 257/18, 257/20, 190, 505, 507, 509, 524
See application file for complete search history.

(56) References Cited

U.S. PATENT DOCUMENTS 4,569,698 A 2/1986 Feist

| | | |
|---|---|---|
| 5,200,351 A | 4/1993 | Hadjizadeh-Amini |
| 5,283,202 A | 2/1994 | Pike, Jr. et al. |
| 5,849,616 A | 12/1998 | Ogoh |
| 5,970,330 A | 10/1999 | Buynoski |
| 6,506,642 B1 | 1/2003 | Luning et al. |
| 6,686,286 B2 | 2/2004 | Yoon |
| 6,815,279 B2 | 11/2004 | Yagishita |

(Continued)

FOREIGN PATENT DOCUMENTS

EP 1487007 A2 12/2004

(Continued)

OTHER PUBLICATIONS

U.S. Appl. No. 11/669,794, filed Jan. 31, 2007.

(Continued)

*Primary Examiner*—Thanh V Pham (57) ABSTRACT

An electronic device can include a transistor structure of a first conductivity type, a field isolation region, and a layer of a first stress type overlying the field isolation region. For example, the transistor structure may be a p-channel transistor structure and the first stress type may be tensile, or the transistor structure may be an n-channel transistor structure and the first stress type may be compressive. The transistor structure can include a channel region that lies within an active region. An edge of the active region includes the interface between the channel region and the field isolation region. From a top view, the layer can include an edge the lies near the edge of the active region. The positional relationship between the edges can affect carrier mobility within the channel region of the transistor structure.

20 Claims, 7 Drawing Sheets

U.S. PATENT DOCUMENTS

| | | |
|---|---|---|
| 6,864,135 B2 | 3/2005 | Grudowski et al. |
| 6,870,179 B2 | 3/2005 | Shaheed et al. |
| 6,872,617 B2 | 3/2005 | Sashida |
| 6,876,081 B2 | 4/2005 | Chow |
| 6,891,192 B2 | 5/2005 | Chen et al. |
| 6,902,971 B2 | 6/2005 | Grudowski |
| 6,933,565 B2 | 8/2005 | Matsumoto et al. |
| 6,982,465 B2 | 1/2006 | Kumagai et al. |
| 7,084,061 B2 | 8/2006 | Sun et al. |
| 7,101,742 B2 | 9/2006 | Ko et al. |
| 7,105,394 B2 | 9/2006 | Hachimine et al. |
| 7,109,568 B2 | 9/2006 | Kumagai et al. |
| 7,138,310 B2 | 11/2006 | Currie et al. |
| 7,163,903 B2 | 1/2007 | Orlowski et al. |
| 7,276,769 B2 | 10/2007 | Yamada et al. |
| 7,279,746 B2 | 10/2007 | Doris et al. |
| 7,297,584 B2 | 11/2007 | Park et al. |
| 7,316,960 B2 | 1/2008 | Ting |
| 7,374,987 B2 | 5/2008 | Chidambarrao et al. |
| 7,423,330 B2 * | 9/2008 | Satoh .................. 257/649 |
| 2003/0194822 A1 * | 10/2003 | Chen et al. ............ 438/18 |
| 2005/0040461 A1 | 2/2005 | Ono et al. |
| 2005/0227425 A1 | 10/2005 | Henley |
| 2005/0285137 A1 | 12/2005 | Satoh |
| 2006/0249794 A1 | 11/2006 | Teh et al. |
| 2006/0281240 A1 | 12/2006 | Grudowski et al. |
| 2007/0012960 A1 | 1/2007 | Knoefler et al. |
| 2007/0090455 A1 | 4/2007 | Lim et al. |
| 2007/0102755 A1 | 5/2007 | Adams et al. |
| 2007/0132031 A1 | 6/2007 | Shroff et al. |

FOREIGN PATENT DOCUMENTS

| | | |
|---|---|---|
| KR | 0567022 B1 | 4/2006 |
| KR | 20060034685 A | 4/2006 |
| KR | 20070011408 A | 1/2007 |
| WO | 2004049406 A1 | 6/2004 |
| WO | 2004114400 A1 | 12/2004 |
| WO | 2005098962 A1 | 10/2005 |

OTHER PUBLICATIONS

Actions on the Merits by U.S.P.T.O, as of Jul. 24, 2008, 5 pgs.

Pidin, S. et al. "A Novel Strain Enhanced CMOS Architecture Using Selectively Deposited High Tensile and High Compressive Silicon Nitride Films," IEDM 2004.

Shimizu, A. et al. "Local Mechanical-Stress Control (LMC): A New Technique for CMOS-Performance Enhancement," IEDM 2001.

Yang, H.S. et al. "Dual Stress Liner for High Performance sub-45nm Gate Length SOI CMOS Manufacturing," IEDM 2004.

PCT Search Report and Written Opinion for corresponding PCT Application No. PCT/US08/50969 mailed Jun. 24, 2008.

Grudowski, P., et al.; 1-D and 2-D Geometry Effects in Uniaxially-Strained Dual Etch Stop Layer Stressor Integrations; 2006 Symposium on VLSI Technology Digest of Technical Papers; IEEE ISBN 1-4244-0005-8/06.

EPC Application No. 06816682.6; Extended Search Report mailed Oct. 7, 2009.

* cited by examiner

ELECTRONIC DEVICE INCLUDING A TRANSISTOR STRUCTURE HAVING AN ACTIVE REGION ADJACENT TO A STRESSOR LAYER

CROSS-REFERENCE TO RELATED APPLICATION

The present application is a divisional application of and claims priority under 35 U.S.C. § 120 to U.S. patent application Ser. No. 11/269,303, entitled "Electronic Device Including a Transistor Structure Having an Active Region Adjacent to a Stressor Layer and a Process for Forming the Electronic Device," filed on Nov. 8, 2005, which is hereby incorporated by reference herein in its entirety.

BACKGROUND

1. Field of the Disclosure

The present invention relates to electronic devices and processes for forming electronic devices, and more particularly, to electronic devices including transistor structures having active regions adjacent to stressor layers and processes for forming the electronic devices.

2. Description of the Related Art

Semiconductor-on-insulator ("SOI") architectures are becoming the more common as electronic and device performance requirements continue to be more demanding. Carrier mobility within the channel regions of the p-channel transistors is an area for continued improvement. Many approaches use a dual stressor layer before forming a premetal dielectric ("PMD") layer. The dual stressor layer can be incorporated into an electronic device as an etch-stop layer before forming the PMD layer. For the dual stressor layer, the etch-stop layer includes a tensile layer over n-channel transistor structures and a compressive layer over the p-channel transistor structures.

Some of the attempts have focused on changing the stress within the active region along the channel length direction of the transistor structure to affect drain current and transconductance of the transistor.

BRIEF DESCRIPTION OF THE DRAWINGS

The invention is illustrated by way of example and not limitation in the accompanying figures.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the invention.

DETAILED DESCRIPTION

An electronic device can include a transistor structure of a first conductivity type, a field isolation region, and a layer of a first stress type overlying the field isolation region. For example, the transistor structure may be a p-channel transistor structure and the first stress type may be tensile, or the transistor structure may be an n-channel transistor structure and the first stress type may be compressive. The transistor structure can include a channel region that lies within an active region. An edge of the active region includes the interface between the channel region and the field isolation region. From a top view, the layer can include an edge that lies near the edge of the active region. In a particular embodiment, the layer has a pattern and does not cover the active region. From a top view, the distance from each of the edges of the active region to its closest corresponding edge of the layer in the channel length direction is not greater than the distance from the each of the edges of the active region to its closest corresponding edge of the layer in the channel width direction. The layer can affect stress within the field isolation region, which in turn can affect the stress within the active region. The positional relationship between the edges of the active region and the layer can help to increase carrier mobility within the channel region of the transistor structure.

Before addressing details of embodiments described below, some terms are defined or clarified. The term "active region" is intended to mean part of a transistor structure through which carriers are designed to flow. The active region includes a channel region, a source region, a drain region, a source/drain region, or any combination thereof for one or more transistor structures.

The term "channel length" is intended to mean a dimension of a channel region of a transistor structure, wherein the dimension represents a minimum distance between a source region and a drain region or between source/drain regions of the transistor structure. From a top view, the channel length is typically in a direction that is substantially perpendicular to channel-source region interface, channel-drain region interface, channel-source/drain region interface, or the like.

The term "channel width" is intended to mean a dimension of a channel region of a transistor structure, wherein the dimension is measured in a direction substantially perpendicular to the channel length. From a top view, the channel width typically extends from one channel region-field isolation region interface to an opposite channel region-field isolation region interface.

The term "lateral stress" is intended to mean a stress within an active region in a direction substantially parallel to a channel length of a transistor structure.

The term "primary surface" is intended to mean a surface from which a transistor structure is subsequently formed. The primary surface may be an original surface of a base material before forming any electronic components or may be a surface of a semiconductor layer that overlies the base material. For example, an exposed surface of a semiconductor layer of a semiconductor-on-insulator substrate can be a primary surface, and not the original surface of the base material.

The term "stress" is intended to mean the composite force resulting from two dissimilar materials contacting each other. Stress can be compressive, zero, or tensile. As used in this specification, compressive stress has a negative value, and tensile stress has a positive value.

The term "transistor structure" is intended to mean a gate electrode and associated channel region, source and drain regions or source/drain regions. A gate dielectric layer may or may not be part of the transistor structure. A transistor structure can be configured to function as a transistor, a capacitor, or a resistor.

The term "transverse stress" is intended to mean a stress within an active region in a direction substantially parallel with a channel width of a transistor structure.

The term "unit of misalignment tolerance" is intended to mean the maximum amount of allowable misalignment at a particular masking level. For example, if a mask can be misaligned +/−10 nm, the unit of misalignment tolerance is 20 nm. The maximum amount of allowable misalignment may be determined in part by the design rules, minimum feature size at the particular masking level, minimum pitch at the particular masking level, or any combination thereof.

The term "vertical stress" is intended to mean a stress from a layer as experienced by an immediately underlying surface.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

Additionally, for clarity and to give a general sense of the scope of the embodiments described herein, the use of the "a" or "an" are employed to describe one or more articles to which "a" or "an" refers. Therefore, the description should be read to include one or at least one whenever "a" or "an" is used, and the singular also includes the plural unless it is clear that the contrary is meant otherwise.

Unless otherwise defined, all technical and scientific terms used herein have the same meaning as commonly understood by one of ordinary skill in the art to which this invention belongs. All publications, patent applications, patents, and other references mentioned herein are incorporated by reference in their entirety. In case of conflict, the present specification, including definitions, will control. In addition, the materials, methods, and examples are illustrative only and not intended to be limiting.

Other features and advantages of the invention will be apparent from the following detailed description, and from the claims.

To the extent not described herein, many details regarding specific materials, processing acts, and circuits are conventional and may be found in textbooks and other sources within the semiconductor and microelectronic arts.

Figure 1:
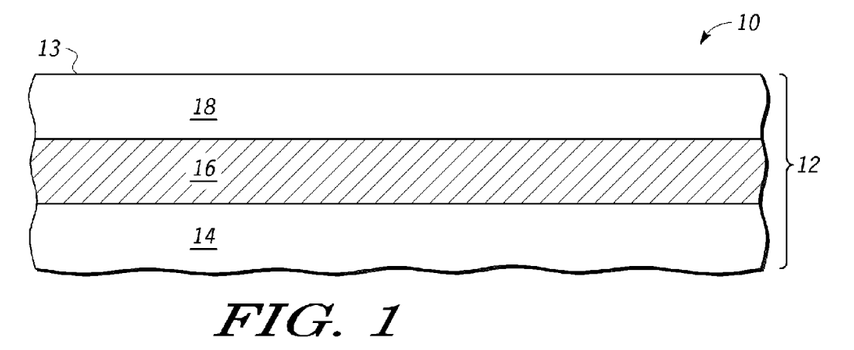
FIG. 1 includes an illustration of a cross-sectional view of a portion of a substrate.

FIG. 1 includes an illustration of a cross-sectional view of a portion of a substrate 12 of an electronic device 10, such as an integrated circuit. Substrate 12 can include a monocrystalline semiconductor wafer, a semiconductor-on-insulator wafer, a flat panel display (e.g., a silicon layer over a glass plate), or other substrate conventionally used to form electronic devices. The upper surface of substrate 12 is primary surface 13. In one embodiment, substrate 12 includes a base material 14, an insulating layer 16 and a semiconductor layer 18 having a primary surface 13 substantially in a (100) crystal plane with edges of subsequently formed channel regions orientation substantially in direction of form <110>.

Figure 2:
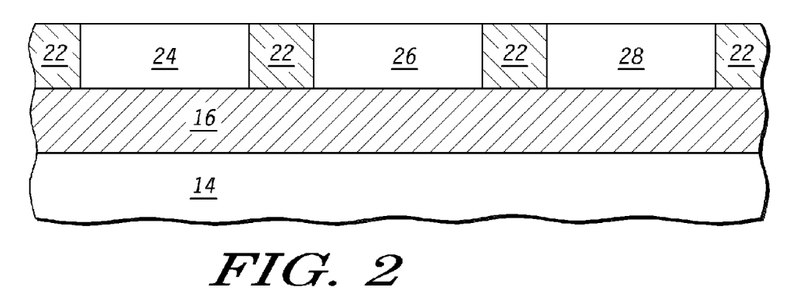
FIGS. 2 and 3 include illustrations of a top view and a cross-sectional view of the workpiece of FIG. 1 after formation of field isolation and active regions.
Figure 3:
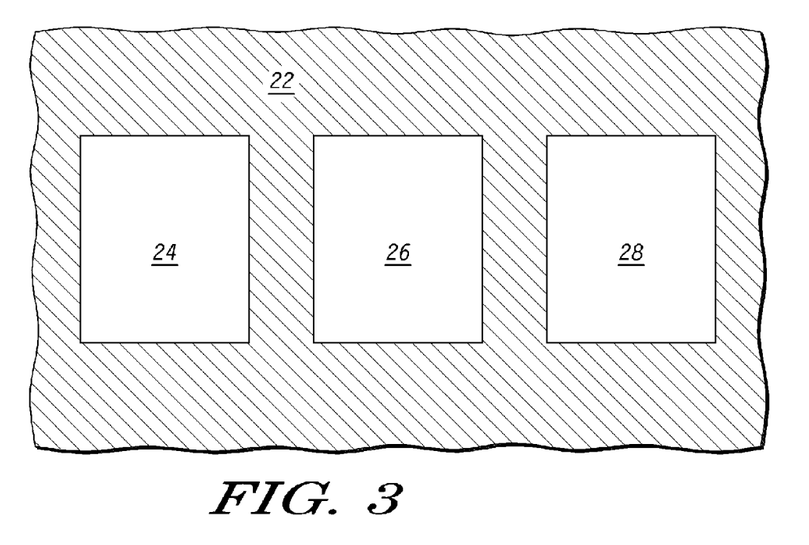

Field isolation region 22 is formed using a conventional or proprietary technique, material or any combination thereof, as illustrated in FIGS. 2 and 3. Field isolation region 22 surrounds each of active regions 24, 26 and 28, with portions of field isolation region 22 between active regions 24 and 26, and 26 and 28. Edges of field isolation region 22 are adjacent to edges of active regions 24, 26 and 28. In one embodiment, active region 24 can include a p-type dopant and include a channel region of a subsequently formed n-channel transistor structure, and active regions 26 and 28 can include an n-type dopant and include a channel region of subsequently formed p-channel transistor structures.

Referring to FIG. 3, each of active regions 24, 26 and 28 include pairs of opposing edges. A pair of opposing edges is oriented vertically in FIG. 3, and another pair of opposing edges that are oriented horizontally in FIG. 3. The significance of the edges will become more apparent after reading the rest of the specification.

Figure 4:
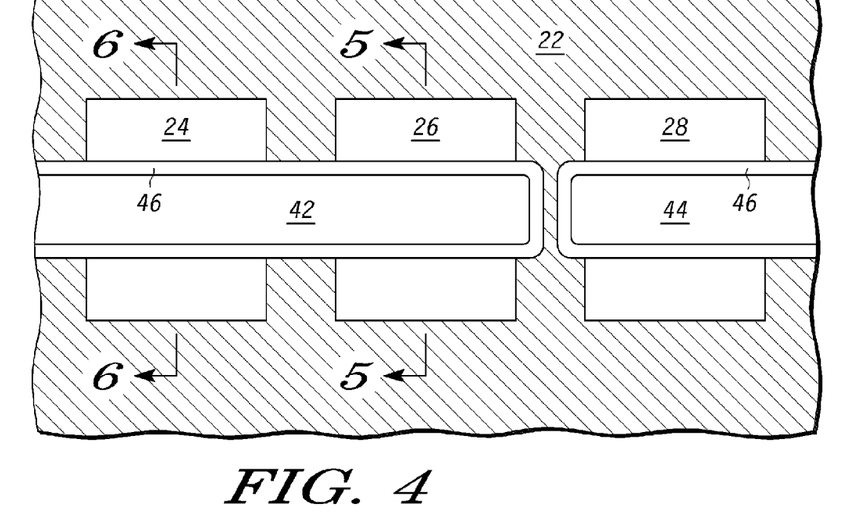
FIG. 4 includes an illustration of a top view of the workpiece of FIGS. 2 and 3 after formation of gate and spacer structures.
Figure 5:
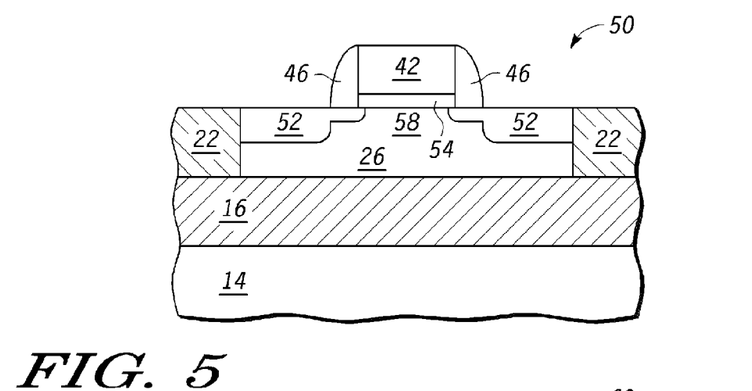
FIG. 5 includes an illustration of a cross-sectional view of the workpiece of FIG. 4 through a p-channel transistor structure.
Figure 6:
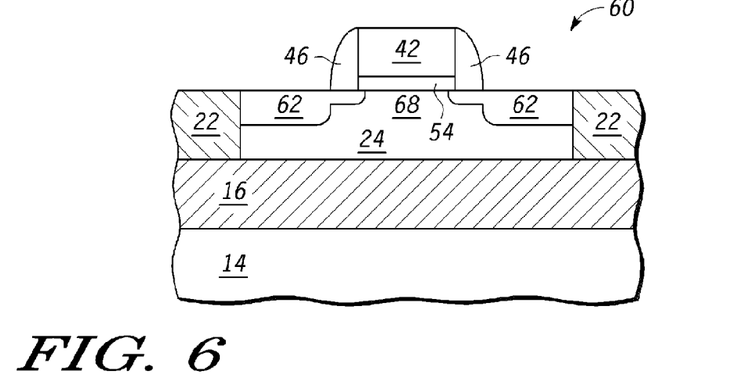
FIG. 6 includes an illustration of a cross-sectional view of the workpiece of FIG. 4 through an n-channel transistor structure.

Transistor structures are formed as illustrated in FIGS. 4, 5 and 6. In one embodiment, both n-channel and p-channel transistor structures can be formed. FIG. 4 illustrates gate electrode 42 overlying portions of active regions 24 and 26 and field isolation region 22, and gate electrode 44 overlying portions of active region 28 and field isolation region 22.

FIG. 5 illustrates a cross-sectional view of a p-channel transistor structure 50 at sectioning line 5-5 in FIG. 4. Transistor structure 50 includes source/drain regions 52 ("S/D regions"), a gate dielectric 54, gate electrode 42 and a spacer structure 46.

Gate dielectric 54 can include one or more films of silicon dioxide, silicon nitride, silicon oxynitride, a high dielectric constant ("high-k") material (e.g., dielectric constant greater than 8), or any combination thereof. The high-k material can include $Hf_aO_bN_c$, $Hf_aSi_bO_c$, $Hf_aSi_bO_cN_d$, $Hf_aZr_bO_cN_d$, $Hf_aZr_bSi_cO_dN_e$, $Hf_aZr_bO_c$, $Zr_aSi_bO_c$, $Zr_aSi_bO_cN_d$, $Zr_aO_b$, other Hf-containing or Zr-containing dielectric material, a doped version of any of the foregoing (lanthanum doped, niobium doped, etc.), or any combination thereof. As used herein, subscripts on compound materials specified with alphabetic subscripts are intended to represent the non-zero fraction of the atomic species present in that compound, and therefore, the alphabetic subscripts within a compound sum to 1. For example, in the case of $Hf_aO_bN_c$, the sum of "a," "b," and "c" is 1. Gate dielectric 54 can have a thickness in a range of approximately 1 to approximately 20 nm. Gate dielectric 54 may be thermally grown using an oxidizing or nitridizing ambient, or deposited using a chemical vapor deposition technique, physical vapor deposition technique, or any combination thereof.

Gate electrode 42 can include a surface portion overlying p-channel region 26. The surface portion substantially sets the work function for the transistor in the completed electronic device. In a more particular embodiment, the surface portion can include a metallic element, such as a transition metal element. In a particular embodiment, all metallic elements within the surface portion include only one or more transition metal elements. For the purposes of this specification, silicon and germanium are not considered metallic elements. In another embodiment, the surface portion may include a second element that is silicon, oxygen, nitrogen or any combination thereof. The surface portion of gate electrode 42 can include $Ti_aN_b$, $Mo_aN_b$, $Mo_aSi_bN_c$, $Ru_aO_b$, $Ir_aO_b$, Ru, Ir, $Mo_aSi_bO$, $Mo_aSi_bO_cN_d$, $Mo_aHf_bO_c$, $Mo_aHf_bO_cN_d$, other transition metal containing material, or any combination thereof.

Another portion of gate electrode 42 may overlie the surface portion. In one embodiment, the overlying portion is relatively more conductive as compared to the surface portion and can include a material such as silicon, polysilicon, a nitride, a metal-containing material, another suitable material, or any combination thereof. In one embodiment, the material can include platinum, palladium, iridium, osmium, ruthenium, rhenium, indium-tin, indium-zinc, aluminum-tin, or any combination thereof. In another embodiment, a material capable of reacting with silicon to form a silicide, and can include Ti, Ta, Co, W, Mo, Zr, Pt, other suitable material, or any combination thereof is formed on gate electrode 42 and later reacted to form a metal silicide. In another embodiment, gate electrode 42 can include the relatively more conductive portion and may not include the surface portion. Gate electrode 42 can have a thickness of between approximately 30 and approximately 500 nm.

Spacer structures 46 can include silicon, polysilicon, a nitride, an oxide an oxynitride, or any combination thereof. The spacer structures 46 can be formed using a conventional or proprietary deposition and etch technique. A cross-section of spacer structure 46 can have one of a plurality of shapes (not illustrated). Such a shape can be substantially triangular, square, L-shaped, or some other shape.

S/D regions 52 can be formed within portions of the active region 26. A p-type dopant, (e.g. boron) is introduced into active region 26 adjacent to gate electrode 42. In one embodiment, the dopant can be introduced using ion implantation. An optional thermal cycle can be performed to activate the dopant. In another embodiment, subsequent processing may have one or more thermal cycles capable of activating the dopant. In yet another embodiment, the doping concentration of doped regions 52 is at least approximately 1E19 atoms/$cm^3$.

Referring to FIG. 5, channel region 58 underlies gate electrode 42 and lies between S/D regions 52. Channel region 58 has a channel length and a channel width. The channel length is the distance between S/D regions 52 at the primary surface 13. The channel width is measured in a direction substantially perpendicular to the channel length. Referring to FIG. 4, the channel width for the transistor structure including active region 26 is the distance between the left-hand and right-hand edges of active region 26, as measured under the gate electrode 42.

Active region 28 includes a transistor structure similar to transistor structure 50, as illustrated in FIG. 5. The materials, thicknesses, and formation techniques for the transistor structure including active region 28 can be the same or different as compared to transistor structure 50. Gate electrode 44 may include a surface portion and an overlying portion that is more conductive (as compared to the surface portion) similar to gate electrode 42. Similar to gate electrode 42, the surface portion is not required.

FIG. 6 illustrates a cross-sectional view of an n-channel transistor structure 60 at sectioning line 6-6 in FIG. 4. Transistor structure 60 includes S/D regions 62, a gate dielectric 54, gate electrode 42 and spacer structures 46. Gate dielectric 54 can be formed using any one or more of the embodiments, as previously described with respect to the transistor structure 50. The portion of gate dielectric layer 54 overlying active region 24 may be the same or different as compared to the portion of gate dielectric layer 54 that overlies active region 26.

Gate electrode 42 can include another surface portion that can substantially set the work function for the transistor structure 60. The surface portion can include $Ta_aC_b$, $Ta_aSi_bN_c$, $Ta_aN_b$, $Ta_aSi_bC_c$, $Hf_aC_b$, $Nb_aC_b$, $Ti_aC_b$, $Ni_aSi_b$, or any combination thereof. The overlying portion of gate electrode 42 can be substantially the same as previously described. The other surface portion is optional and is not required.

An n-type dopant (e.g. arsenic, phosphorus, antimony, or any combination thereof) can be introduced into active region 24 adjacent to gate electrode 42 to form S/D regions 62. The dopant may be introduced and activated as previously described for S/D regions 52. In one embodiment, the doping concentration of S/D regions 62 is at least approximately 1E19 atoms/$cm^3$. In another embodiment, (not illustrated), the materials or techniques for forming portions of transistor structure 60 could be the same or different from those used to form portions of transistor structure 50. Formation of portions of transistor structures 50 and 60 can occur at the same or different times.

Referring to FIG. 6, channel region 68 underlies gate electrode 42 and between S/D regions 62. Channel region 68 has a channel length and a channel width. The channel length is the distance between S/D regions 62 at the primary surface 13. The channel width is measured in a direction substantially perpendicular to the channel length. Referring to FIG. 4, the channel width for the transistor structure including active region 24 is the distance between the left-hand and right-hand edges of active region 24, as measured under the gate electrode 42.

Figure 7:
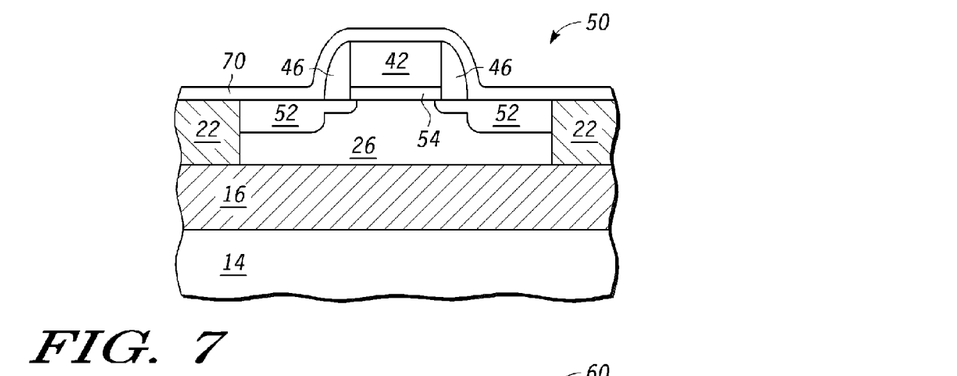
FIGS. 7 and 8 include an illustration of a cross-sectional view of the workpiece of FIGS. 5 and 6, respectively, after formation of an insulating layer.
Figure 8:
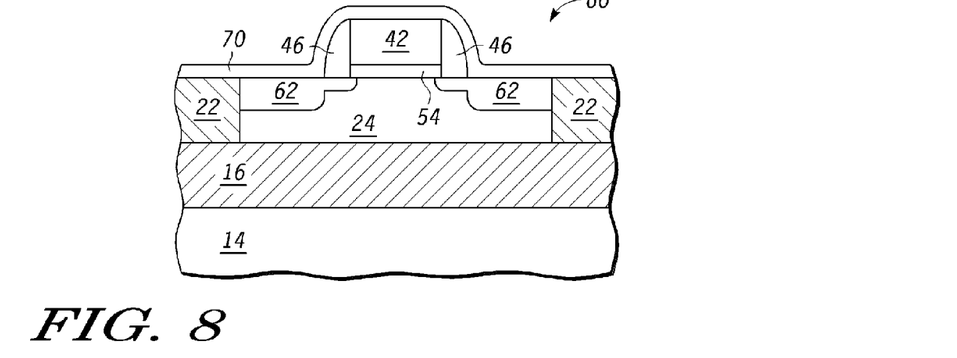

Insulating layer 70 is formed overlying substrate 12, including field isolation region 22, and active regions 24 and 26, as illustrated in FIGS. 7 and 8, and active region 28 (not illustrated in FIG. 7 or 8), using conventional or proprietary process. Insulating layer 70 can include an oxide, a nitride, an oxynitride, or a combination thereof. Insulating layer 70 can be grown or deposited. The magnitude of the stress is a function of the thickness and inherent stress of the overlying film. One or more process parameters such as pressure, temperature, gas ratio, power density, frequency, irradiation, ion implantation, or any combination thereof, can be used to affect the stress in a film. In one embodiment, a plasma-enhanced chemical vapor deposition ("PECVD") can be used to deposit a tensile film or a compressive film. In another embodiment, the process parameter(s) can increase or decrease the magnitude of the stress without changing type of stress (i.e., tensile or compressive)

In one embodiment, insulating layer 70 has a compressive stress. In a particular embodiment, insulating layer 70 has a compressive stress of not less than approximately 1.4 GPa. In an even more specific embodiment, insulating layer 70 has a compressive stress between approximately 1.6 and approximately 3.2 GPa. In another embodiment, insulating layer 70 is not greater than approximately 200 nm in thickness, and in a particular embodiment, is not greater than approximately 90 nm. In a more particular embodiment, insulating layer 70 is in a range of approximately 40 nm to approximately 90 nm. In another embodiment, portions of insulating layer 70 can function as an etch stop layer during subsequent processing.

In one embodiment, the reactor vessel is a portion of a single-substrate-processing tool with a dual frequency radiofrequency ("RF") generator and a height-adjustable chuck designed to process substrates with a nominal diameter of 200 mm. In a particular embodiment, the process can be performed in a PRODUCER™ brand or CENTURA™ brand chamber made by Applied Materials, Inc. of Santa Clara, Calif. In one embodiment, the pressure can be in a range of approximately 1 to approximately 10 Torr. In a more particular embodiment, the pressure can be in a range of approximately 2 to approximately 6.5 Torr. In another embodiment, the temperature of the chuck can be in a range of approximately 200° C. to approximately 600° C. In a more particular embodiment, the temperature can be in a range of approximately 350° C. to approximately 600° C. In another embodiment, the partially-formed electronic device 10 at this point in the process may only tolerate temperatures up to approximately 400° C.

In another embodiment, when a nitrogen-containing precursor and a silicon-containing precursor are used to form a silicon nitride film, the flow of nitrogen-containing precursor can be in a range of approximately 1.5 to approximately 5 times greater than the silicon-containing precursor. In a more particular embodiment, ammonia can be the nitrogen-containing precursor, and silane can be the silicon-containing precursor. In an even more particular embodiment, the carrier gas stream can include a relatively inert gas, such as nitrogen, helium, argon, or a combination thereof. In still another particular embodiment, the total RF power density can be in a range of approximately 0.1 to approximately 1.6 watts per square centimeter ("W/cm$^2$") while the substrate spacing can be in a range of 0.63 to approximately 1.27 cm. In a more particular embodiment, when a compressive silicon nitride film is formed, the total RF power density can be in a range of approximately 0.48 to approximately 0.80 W/cm$^2$ while the substrate spacing is in a range of approximately 0.74 to approximately 1.14 cm. In another more particular embodiment, with a tensile silicon nitride film is formed, the total RF power density can be in a range of 0.064 and 0.318 W/cm$^2$ while the substrate spacing can be in a range of approximately 1.02 to approximately 1.27 cm. The RF power can be at one or more frequencies, and therefore, total RF power density is the sum of the RF power at each frequency divided by the area of the primary surface 13.

Figure 9:
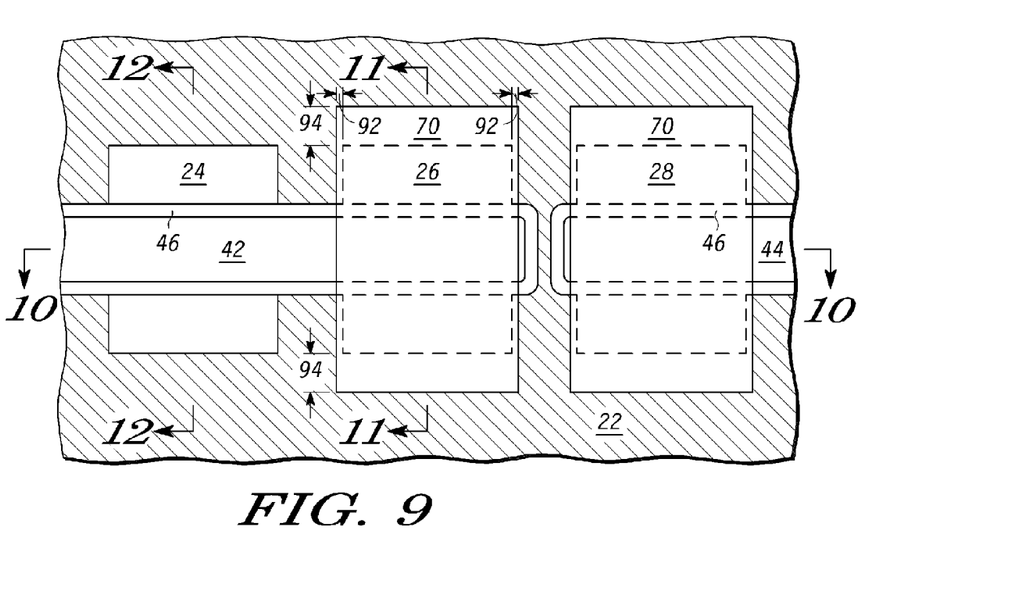
FIG. 9 includes an illustration of a top view of the workpiece of FIGS. 7 and 8 after removal of a portion of an insulating layer from over an n-channel region and portions of the field isolation region.

Insulating layer 70 is then patterned to expose active region 24 and portions of the field isolation region 22 between active regions 26 and 28, as illustrated in FIGS. 9 through 12. Each of active regions 26 and 28 is substantially covered by a remaining portion of insulating layer 70, with part of each remaining portion overlying field isolation region 22. In one embodiment, from a top view as illustrated in FIG. 9, the distance from each of the edges of the active regions 26 and 28 to its closest corresponding edge of the remaining portion of insulating layer 70 in the channel length direction (i.e., distance 92 as illustrated in FIG. 9) is not greater than the distance from the each of the edges of the active regions 26 and 28 to its closest corresponding edge of the remaining portion of insulating layer 70 in the channel width direction (i.e., distance 94 as illustrated in FIG. 9). In one embodiment, each of distances 92 is less than each of distances 94. In one particular embodiment, the sum of distances 92 is substantially equal to one unit of misalignment tolerance, and the sum of the distances 94 are significantly larger than one unit of misalignment tolerance.

Figure 10:
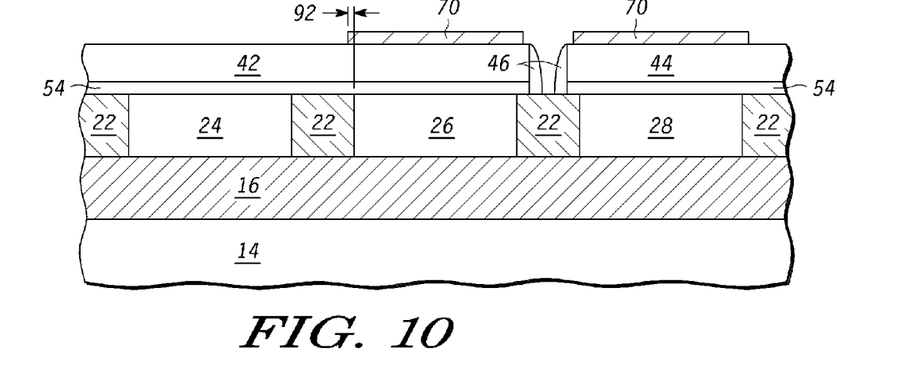
FIGS. 10 through 12 include illustrations of cross-sectional views of the workpiece of FIG. 9 at the sectioning lines as indicated in FIG. 9.
Figure 11:
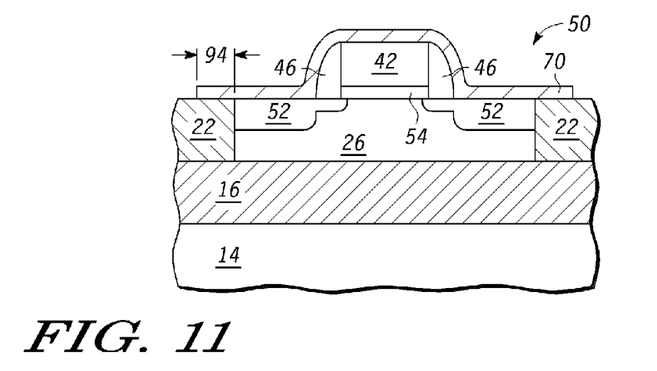
Figure 12:
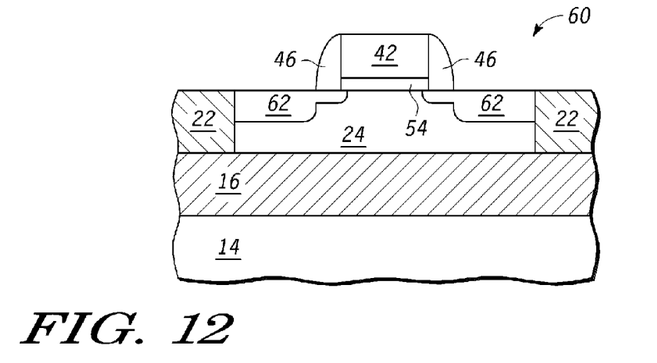

FIG. 10 illustrates a cross-sectional view of the workpiece along sectioning line 10-10 in FIG. 9. In a particular embodiment, the distance from each of the edges of active regions 26 and 28 to its corresponding edge of the overlying portions of insulating layer 70 is less than one-half of a unit of misalignment tolerance. One of distances 92 is illustrated in FIG. 10. FIGS. 11 and 12 illustrate cross-sectional views of active region 24 and 26, respectively, along sectioning lines 11-11 and 12-12, respectively. One of distances 94 is illustrated in FIG. 11.

Figure 13:
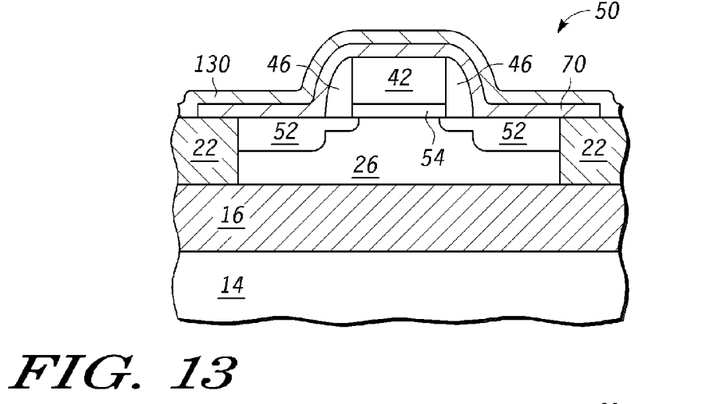
FIGS. 13 and 14 include illustrations of cross-sectional views of the workpiece of FIGS. 11 and 12, respectively, after formation of a tensile layer.
Figure 14:
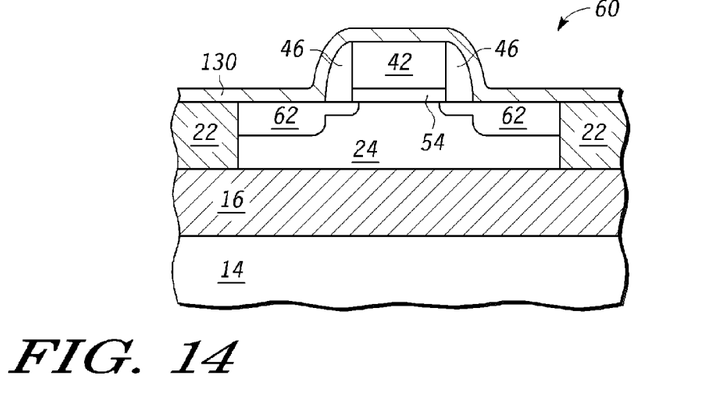

A tensile layer 130 is formed over substrate 12, including field isolation region 22, and active regions 24, 26 and 28 as illustrated in FIGS. 13 and 14, using conventional or proprietary deposition process. Tensile layer 130 can be formed of any combination of materials by using any of the processes previously described for insulating layer 70. In one embodiment, tensile layer 130 is more tensile than insulating layer 70. In a particular embodiment, tensile layer 130 has a tensile stress not less than approximately 0.6 GPa in magnitude. In an even more particular embodiment, tensile layer 130 has a tensile stress in a range of approximately 1.0 to approximately 3.0 GPa in magnitude. Tensile layer 130 can have a thickness similar to those described for insulating layer 70. In one embodiment, tensile layer 130 has the substantially the same thickness as insulating layer 70. In another embodiment, tensile layer 130 has substantially the same chemical composition as insulating layer 70.

A patterning layer is formed overlying tensile layer 130 that is substantially the negative image of the pattern used to pattern insulating layer 70. Portions of insulating layer 130 overlying remaining portions of insulating layer 70 are then removed to create openings in tensile layer 130 with edges adjacent to the edges of the remaining portions of insulating layer 70. The pairs of corresponding edges can have substantially the same position relative to the underlying active regions as previously described for remaining portions of insulating layer 70. Thus, distances 152 are substantially the same as distances 92 (FIG. 9), and distances 154 are substantially the same as distances 94 (FIG. 9), as illustrated in FIG. 15.

A film with more positive stress (i.e., more tensile) can have a higher chemical etch rate than a film of substantially the same composition with a more negative stress (i.e., more compressive). In one embodiment, the wet etch rate of tensile layer 130 is at least twice that of remaining portions of insulating layer 70. When insulating layer 70 and tensile layer 130 include silicon nitride, an HF solution can be used as a wet chemical etchant. In one embodiment, the HF solution can have a concentration in a range of approximately 10:1 (10 parts water to 1 part HF) to approximately 1000:1, and in a particular embodiment can be in a range of approximately 50:1 to approximately 200:1. In a particular embodiment, insulating layer 130 (more tensile) etches at a rate at least approximately six times higher than insulating layer 70 (more compressive), and in a particular embodiment, etches at a rate in a range of approximately 10 to 15 times higher. Thus, wet chemical etching can be used to selectively remove portions of the insulating layer 130 that overlie the remaining portions of insulating layer 70 without removing too much of the underlying insulating layer 70.

Figure 15:
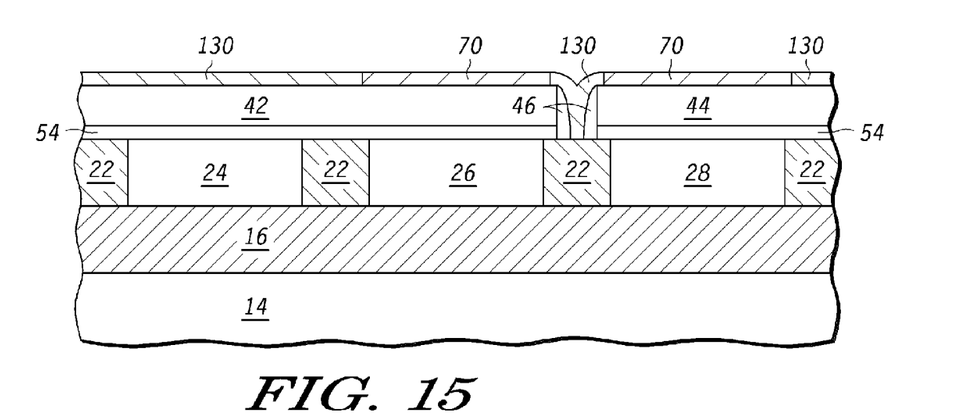
FIGS. 15 and 16 include illustrations of a top view and a cross-sectional view, respectively, of the workpiece of FIGS. 13 and 14 after removal of portions of the tensile layer.
Figure 16:
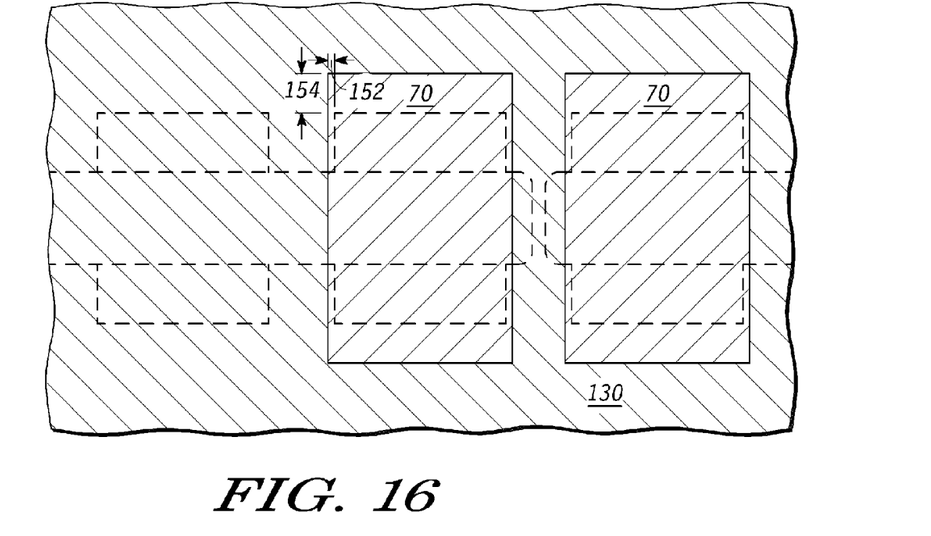

The patterning layer is removed leaving the workpiece as illustrated in FIGS. 15 and 16. In one embodiment, remaining portions of insulating layer 70 and tensile layer 130 can act as an etch stop layer during subsequent processing, particularly when subsequently forming contact openings through a subsequently formed insulating layer. In one embodiment, from a top view, the portion of tensile layer 130 between active regions 26 and 28 overlies only a portion of field isolation region 22. In another embodiment, tensile layer 130 would overlie substantially the entire field isolation region between the two active regions 26 and 28 and overlie substantially none of active regions 26 and 28 (i.e., from a top view, the edges of the openings within the tensile layer 130 would be line-on-line with the edges of the active regions 26 and 28). In still another embodiment, the portion of tensile layer 130 between active regions 26 and 28 can encroach slightly onto one or both of those regions.

In an alternative embodiment tensile layer 130 can be formed and opened prior to formation of remaining portions of insulating layer 70. In another alternative embodiment, the insulating layer 70 is not formed. Insulating layer 70 can be compressive, have no stress, or be slightly tensile. As the difference in stresses between insulating layer 70 and 130 increase, the difference in etch rate should also increase, with the more tensile of the two layers etching at a relatively higher rate.

Figure 17:
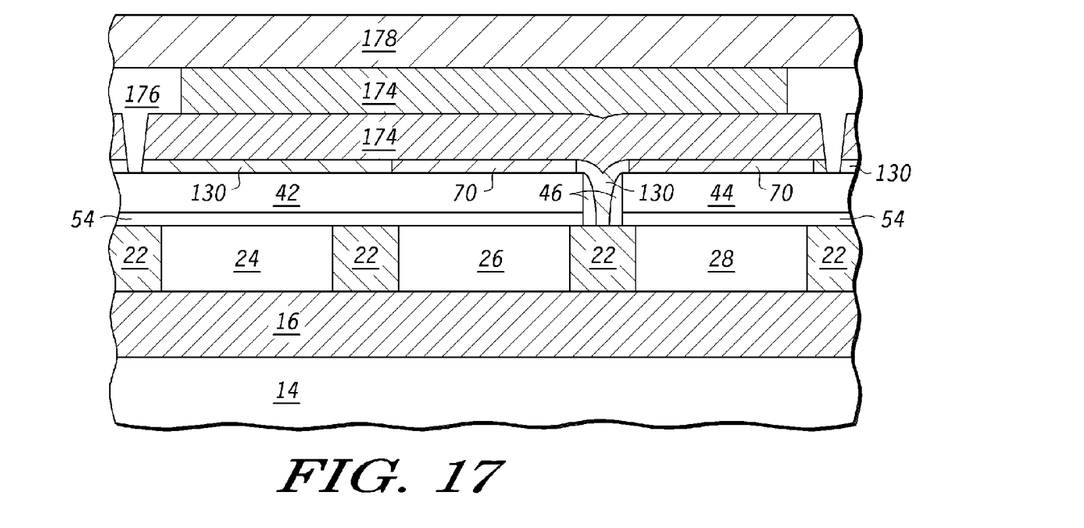
FIG. 17 includes an illustration of a cross-sectional view of the workpiece of FIG. 16 after fabrication of an electronic device is substantially completed.

Processing can be continued to form a substantially completed electronic device, as illustrated in FIG. 17. One or more insulating layers 174, one or more conductive layers 176, and one or more encapsulating layers 178 are formed using one or more conventional or proprietary techniques.

Figure 18:
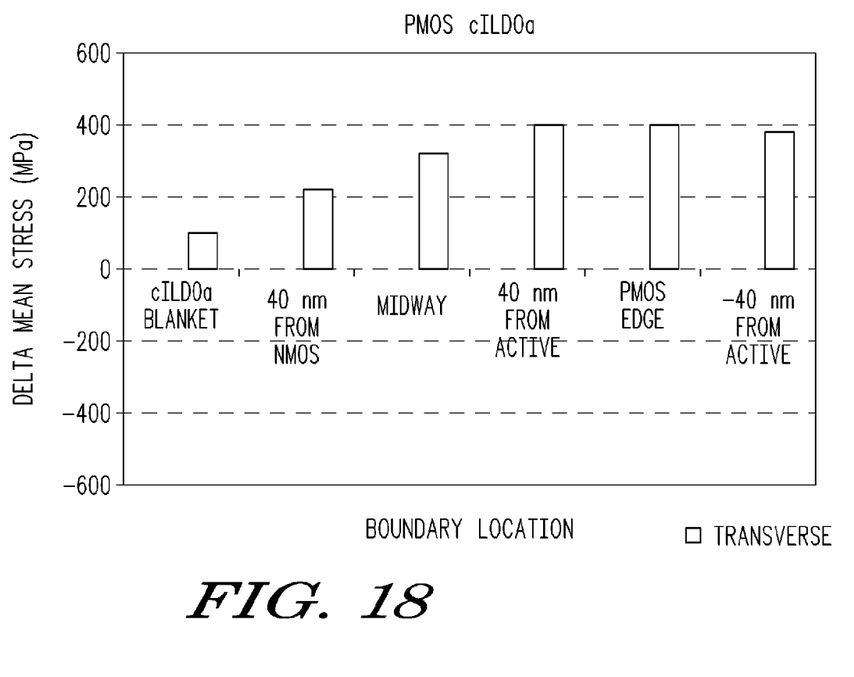
FIG. 18 includes a chart illustrating change in stress along the channel width direction as a function of distance, as measured from a top view, between an edge of an active region and an edge of the tensile layer, with the distance decreasing from location 1 to location 6.

FIG. 18 includes data illustrating delta mean stress as a function of location (e.g., distance 152 in FIG. 15). Location 1 corresponds to no tensile layer 130 (e.g., blanket insulating layer 70), location 2 corresponds to the edge between tensile layer 130 and insulating layer 70 being closer to active region 24 as compared to active region 26 (e.g., approximately 40 nm from the edge of the active region 24 as measured from a top view), location 3 corresponds to the edge between tensile layer 130 and insulating layer 70 being midway between active region 24 and active region 26, location 4 corresponds to the edge between tensile layer 130 and insulating layer 70 being closer to active region 26 as compared to active region 24 (e.g., approximately 40 nm from the edge of the active region 26 as measured from a top view), location 5 corresponds to the edge between tensile layer 130 and insulating layer 70 overlying an edge of active region 26, and location 6 corresponds to the edge between tensile layer 130 and insulating layer 70 encroaching over active region 26 (e.g., approximately 40 nm onto the active region 26 as measured from a top view).

The data in FIG. 18 indicate that the delta mean stress in the channel width direction increases until the edge between the tensile layer 130 and the insulating layer 70 is line-on-line with the underlying edge of active region 26. The delta mean stress decreases as a function of the distance between the two edges, as measured from a top view, increases, with the decreased delta mean stress decreasing as a stronger function when the tensile layer 130 overlies the active region 26 as opposed to when the tensile layer 130 does not overlie the active region 26. Still, the tensile layer 130 can still overlie a relatively small portion of the active region 26 and still provide sufficient delta mean stress. The net effect of the increased delta mean stress can be increased carrier mobility within the active region 26 for p-channel transistor structures. Increased carrier mobility can improve p-channel transistor performance. Also, as the difference in stress between the tensile layer 130 and compressive layer 70 increases, the magnitude of the stress enhancement in the channel increases.

The insulating film 130 overlying the field isolation region between the p-channel transistor structures may improve the electrical characteristics by increasing carrier mobility. For example, a p-channel transistor structure can be oriented substantially in a direction of form <110>, whether the primary surface of the active region lies on a (100) or (110) crystal plane. For a p-channel transistor structure oriented substantially in a direction of form <100>, carrier mobility may or may not be degraded when the active region has a primary surface lying on a (100) or (110) crystal plane.

In an alternative embodiment, the conductivity types and stresses can be reversed. For example, active region 24 could be n-type doped and include a channel region of a subsequently formed p-channel transistor structure, and active regions 26 and 28 can be p-type doped and include a channel region of a subsequently formed n-channel transistor structure, insulating layer 70 can be a tensile film, and insulating layer 130 can be a compressive film. The compressive film overlying the field isolation region between the n-channel transistor structures may improve the electrical characteristics by increasing carrier mobility. For example, an n-channel transistor structure can be oriented substantially in a direction of form <110>, whether the primary surface of the active region lies on a (100) or (110) crystal plane. For a n-channel transistor structure oriented substantially in a direction of form <100>, carrier mobility may be enhanced for an active region having a the primary surface lying on a (110), but may be degraded when the active region has a primary surface lying on a (100) crystal plane.

Many different aspects and embodiments are possible. Some of those aspects and embodiments are described below. After reading this specification, skilled artisans will appreciate that those aspects and embodiments are only illustrative and do not limit the scope of the present invention.

In a non-limiting aspect, an electronic device can include a first transistor structure of a first conductivity type including a first active region having a first edge that extends substantially along a first channel length direction, and a second transistor structure of the first conductive type including a second active region having a first edge that extends substantially along a second channel length direction. The electronic device can also include a portion of a field isolation region lying between the first and second active regions, and a first portion of a first layer of a first stress type overlying the portion of the field isolation region. The first portion of the first layer may not be a sidewall spacer. The first portion of the first layer can have a first edge and a second edge opposite the first edge, wherein the first edge of the first portion of the first layer lies closer to the first edge of the first active region as compared to the first edge of the second active region, and the second edge of the first portion of the first layer lies closer to the first edge of the second active region as compared to the first edge of the first active region.

In an embodiment of the non-limiting aspect, the first transistor structure includes a p-channel transistor structure, and the first stress type is compressive. In a particular embodiment, each of the first and second active regions includes a primary surface lying on a (100) or (110) crystal plane and oriented substantially in a direction of form <110>. In another embodiment, the first active region includes a channel width. The first active region underlies the first portion of the first layer, wherein from a top view, the first portion of the first layer has a dimension that is measured in a direction substantially parallel to the channel width. The dimension is no greater than approximately a sum of the channel width and one unit of misalignment tolerance for a mask used to define the opening within the tensile layer.

In still another embodiment of the non-limiting aspect, the first transistor structure includes an n-channel transistor structure, and the first stress type is tensile. In another particular embodiment, each of the first and second active regions includes a primary surface lying on a (100) or (110) crystal plane and oriented substantially in a direction of form <100> or <110>.

In yet another embodiment of the non-limiting aspect, the first active region further includes a second edge, a third edge, and a fourth edge, wherein from a top view, the first and second edges of the first active region lie along a first pair of opposite edges of the first active region, and the third and fourth edges of the first active region lie along a second pair of opposite edges of the first active region. The first portion of the first layer further includes a third edge, and a fourth edge. From the top view, the second edge of the first portion of the first layer lies adjacent to the second edge of the first active region, the third edge of the first portion of the first layer lies adjacent to the third edge of the first active region, and the fourth edge of the first portion of the first layer lies adjacent to the fourth edge of the first active region. A first distance is a distance between the first edge of the first active region and the first edge of the first portion of the first layer, a second distance is a distance between the second edge of the first active region and the second edge of the first portion of the first layer, a third distance is a distance between the third edge of the first active region and the third edge of the first portion of the first layer, and a fourth distance is a distance between the fourth edge of the fourth active region and the fourth edge of the first portion of the first layer. A first sum is a sum of the first and second distances, and a second sum is a sum of the third and fourth distances, and the first sum is less than the second sum.

In a further embodiment of the non-limiting aspect, the electronic device further includes a second portion of the first layer overlying the portion of the field isolation region and the second active region, wherein the first and second portions of the first layer are separate and spaced apart from one another. In a particular embodiment, from a top view, some, but not all, of the portion of the field isolation region lies between the first and second portions of the first layer. In another particular embodiment, each of the first and second active regions includes a primary surface lying on a (100) or (110) crystal plane and oriented substantially in a direction of form <100>. In still another particular embodiment, the second portion of the first layer has a first edge and a second edge opposite the first edge, wherein the first edge of the second portion of the first layer lies closer to the first edge of the second active region as compared to the first edge of the first active region, and the second edge of the second portion of the first layer lies closer to the second edge of the second active region as compared to the first edge of the second active region.

In a further particular embodiment of the non-limiting aspect, the first active region further includes a second edge, a third edge, and a fourth edge, wherein from a top view, the first and second edges of the first active region lie along a first pair of opposite edges of the first active region, and the third and fourth edges of the first active region lie along a second pair of opposite edges of the first active region. The first portion of the first layer further includes a third edge and a fourth edge. From the top view, the second edge of the first portion of the first layer lies adjacent to the second edge of the first active region, the third edge of the first portion of the first layer lies adjacent to the third edge of the first active region, and the fourth edge of the first portion of the first layer lies adjacent to the fourth edge of the first active region. A first distance is a distance between the first edge of the first active region and the first edge of the first portion of the first layer, a second distance is a distance between the second edge of the first active region and the second edge of the first portion of the first layer, a third distance is a distance between the third edge of the first active region and the third edge of the first portion of the first layer, and a fourth distance is a distance between the fourth edge of the fourth active region and the fourth edge of the first portion of the first layer. A first sum is a sum of the first and second distances, and a second sum is a sum of the third and fourth distances, wherein the first sum is less than the second sum.

In a more particular embodiment of the non-limiting aspect, the second active region further includes a second edge, a third edge, and a fourth edge, wherein from the top view, the first and second edges of the second active region lie along a first pair of opposite edges of the second active region and the third and fourth edges of the second active region lie along a second pair of opposite edges of the second active region. The second portion of the first layer further includes a third edge and a fourth edge. From the top view, the second edge of the second portion of the first layer lies adjacent to the second edge of the second active region, the third edge of the second portion of the first layer lies adjacent to the third edge of the second active region, and the fourth edge of the second portion of the first layer lies adjacent to the fourth edge of the second active region. A fifth distance is a distance between the first edge of the second active region and the first edge of the second portion of the first layer, a sixth distance is a distance between the second edge of the second active region and the second edge of the second portion of the first layer, a seventh distance is a distance between the third edge of the second active region and the third edge of the second portion of the first layer, and an eighth distance is a distance between the fourth edge of the second active region and the fourth edge of the second portion of the first layer. A third sum is a sum of the fifth and sixth distances, and a fourth sum is a sum of the seventh and eighth distances, wherein the third sum is less than the fourth sum.

In still a further embodiment of the non-limiting aspect, the electronic device further includes a third transistor structure of a second conductivity type opposite the first conductivity type, wherein the third transistor structure includes a third active region having a first edge that extends substantially along a third channel length direction. The electronic device still further includes a second layer of a second stress type opposite the first stress type, wherein the second layer overlies the third active region and is not a sidewall spacer. In a particular embodiment, the second layer overlies substantially all of the third active region. In a more particular embodiment, the second layer overlies the portion of the field isolation region. In another particular embodiment, the first and second transistor structures include p-channel transistor structures, the third transistor structure includes an n-channel transistor structure, the first stress type is compressive, and the second stress type is tensile.

In a further particular embodiment of the non-limit aspect, the second layer has a pattern that is a reverse image of the first layer. In still a further particular embodiment, the electronic device further includes a second portion of the first layer, wherein the first and second portions of the first layer are separate and spaced apart from one another. Substantially all of the first active region is covered by the first portion of the first layer, and substantially none of the second portion of the first layer and the second layer overlies the first active region, substantially all of the second active region is covered by the second portion of the first layer, and substantially none of the first portion of the first layer and the second layer overlies the second active region, and substantially all of the third active region is covered by the second layer, and substantially none of the first and second portions of the first layer overlies the third active region. In yet a further particular embodiment, each of the first, second, and third active regions includes a primary surface lying on a (100) or (110) crystal plane and oriented substantially in a direction of form <110>.

Note that not all of the activities described above in the general description or the examples are required, that a portion of a specific activity may not be required, and that one or more further activities may be performed in addition to those described. Still further, the order in which activities are listed are not necessarily the order in which they are performed. After reading this specification, skilled artisans will be capable of determining what activities can be used for their specific needs or desires.

Any one or more benefits, one or more other advantages, one or more solutions to one or more problems, or any combination thereof have been described above with regard to one or more specific embodiments. However, the benefit(s), advantage(s), solution(s) to problem(s), or any element(s) that may cause any benefit, advantage, or solution to occur or become more pronounced is not to be construed as a critical, required, or essential feature or element of any or all the claims.

The above-disclosed subject matter is to be considered illustrative, and not restrictive, and the appended claims are intended to cover all such modifications, enhancements, and other embodiments that fall within the scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. An electronic device comprising:
   a first transistor structure of a first conductivity type including a first active region having a first edge that extends substantially along a first channel length direction;
   a second transistor structure of the first conductive type including a second active region having a first edge that extends substantially along a second channel length direction;
   a portion of a field isolation region lying between the first and second active regions; and
   a first portion of a first layer of a first stress type overlying the portion of the field isolation region, wherein:
     the first portion of the first layer is not a sidewall spacer;
     the first portion of the first layer has a first edge and a second edge opposite the first edge;
     the first edge of the first portion of the first layer lies closer to the first edge of the first active region as compared to the first edge of the second active region; and
     the second edge of the first portion of the first layer lies closer to the first edge of the second active region as compared to the first edge of the first active region.

2. The electronic device of claim 1, wherein the first transistor structure comprises a p-channel transistor structure, and the first stress type is compressive.

3. The electronic device of claim 2, wherein each of the first and second active regions comprises a primary surface lying on a (100) or (110) crystal plane and oriented substantially in a direction of form <110>.

4. The electronic device of claim 1, wherein:
   the first active region comprises a channel width;
   the first active region underlies the first portion of the first layer, wherein from a top view, the first portion of the first layer has a dimension that is measured in a direction substantially parallel to the channel width; and
   the dimension is no greater than approximately a sum of the channel width and one unit of misalignment tolerance for a mask used to define the opening within the first layer.

5. The electronic device of claim 1, wherein the first transistor structure comprises an n-channel transistor structure, and the first stress type is tensile.

6. The electronic device of claim 5, wherein each of the first and second active regions comprises a primary surface lying on a (100) or (110) crystal plane and oriented substantially in a direction of form <100> or <110>.

7. The electronic device of claim 1, wherein:
   the first active region further comprises a second edge, a third edge, and a fourth edge, wherein from a top view, the first and second edges of the first active region lie along a first pair of opposite edges of the first active region, and the third and fourth edges of the first active region lie along a second pair of opposite edges of the first active region; and
   the first portion of the first layer further comprises a third edge, and a fourth edge, wherein from the top view:
     the second edge of the first portion of the first layer lies adjacent to the second edge of the first active region;
     the third edge of the first portion of the first layer lies adjacent to the third edge of the first active region;
     the fourth edge of the first portion of the first layer lies adjacent to the fourth edge of the first active region;
     a first distance is a distance between the first edge of the first active region and the first edge of the first portion of the first layer;
     a second distance is a distance between the second edge of the first active region and the second edge of the first portion of the first layer;
     a third distance is a distance between the third edge of the first active region and the third edge of the first portion of the first layer;
     a fourth distance is a distance between the fourth edge of the first active region and the fourth edge of the first portion of the first layer;
     a first sum is a sum of the first and second distances, and a second sum is a sum of the third and fourth distances; and
     the first sum is less than the second sum.

8. The electronic device of claim 1, further comprising a second portion of the first layer overlying the portion of the field isolation region and the second active region, wherein the first and second portions of the first layer are separate and spaced apart from one another.

9. The electronic device of claim 8, wherein from a top view, some, but not all, of the portion of the field isolation region lies between the first and second portions of the first layer.

10. The electronic device of claim 8, wherein each of the first and second active regions comprises a primary surface lying on a (100) or (110) crystal plane and oriented substantially in a direction of form <100>.

11. The electronic device of claim 8, wherein:
   the second portion of the first layer has a first edge and a second edge opposite the first edge;

the first edge of the second portion of the first layer lies closer to the first edge of the second active region as compared to the first edge of the first active region; and the second edge of the second portion of the first layer lies closer to the second edge of the second active region as compared to the first edge of the second active region.

12. The electronic device of claim 8, wherein:

the first active region further comprises a second edge, a third edge, and a fourth edge, wherein from a top view, the first and second edges of the first active region lie along a first pair of opposite edges of the first active region, and the third and fourth edges of the first active region lie along a second pair of opposite edges of the first active region; and the first portion of the first layer further comprises a third edge and a fourth edge, wherein from the top view:

the second edge of the first portion of the first layer lies adjacent to the second edge of the first active region;

the third edge of the first portion of the first layer lies adjacent to the third edge of the first active region;

the fourth edge of the first portion of the first layer lies adjacent to the fourth edge of the first active region;

a first distance is a distance between the first edge of the first active region and the first edge of the first portion of the first layer;

a second distance is a distance between the second edge of the first active region and the second edge of the first portion of the first layer;

a third distance is a distance between the third edge of the first active region and the third edge of the first portion of the first layer;

a fourth distance is a distance between the fourth edge of the fourth active region and the fourth edge of the first portion of the first layer;

a first sum is a sum of the first and second distances, and a second sum is a sum of the third and fourth distances; and the first sum is less than the second sum.

13. The electronic device of claim 12, wherein:

the second active region further comprises a second edge, a third edge, and a fourth edge, wherein from the top view, the first and second edges of the second active region lie along a first pair of opposite edges of the second active region, and the third and fourth edges of the second active region lie along a second pair of opposite edges of the second active region; and the second portion of the first layer further comprises a third edge and a fourth edge, wherein from the top view:

the second edge of the second portion of the first layer lies adjacent to the second edge of the second active region;

the third edge of the second portion of the first layer lies adjacent to the third edge of the second active region;

the fourth edge of the second portion of the first layer lies adjacent to the fourth edge of the second active region;

a fifth distance is a distance between the first edge of the second active region and the first edge of the second portion of the first layer;

a sixth distance is a distance between the second edge of the second active region and the second edge of the second portion of the first layer;

a seventh distance is a distance between the third edge of the second active region and the third edge of the second portion of the first layer;

an eighth distance is a distance between the fourth edge of the second active region and the fourth edge of the second portion of the first layer;

a third sum is a sum of the fifth and sixth distances, and a fourth sum is a sum of the seventh and eighth distances; and the third sum is less than the fourth sum.

14. The electronic device of claim 1, further comprising:

a third transistor structure of a second conductivity type opposite the first conductivity type, wherein the third transistor structure includes a third active region having a first edge that extends substantially along a third channel length direction; and a second layer of a second stress type opposite the first stress type, wherein the second layer overlies the third active region and is not a sidewall spacer.

15. The electronic device of claim 14, wherein the second layer overlies substantially all of the third active region.

16. The electronic device of claim 15, wherein the second layer overlies the portion of the field isolation region.

17. The electronic device of claim 14, wherein:

the first and second transistor structures comprise p-channel transistor structures;

the third transistor structure comprises an n-channel transistor structure;

the first stress type is compressive; and the second stress type is tensile.

18. The electronic device of claim 14, wherein the second layer has a pattern that is a reverse image of the first layer.

19. The electronic device of claim 14, further comprising a second portion of the first layer, wherein:

the first and second portions of the first layer are separate and spaced apart from one another;

substantially all of the first active region is covered by the first portion of the first layer, and substantially none of the second portion of the first layer and the second layer overlies the first active region;

substantially all of the second active region is covered by the second portion of the first layer, and substantially none of the first portion of the first layer and the second layer overlies the second active region; and substantially all of the third active region is covered by the second layer, and substantially none of the first and second portions of the first layer overlies the third active region.

20. The electronic device of claim 14, wherein each of the first, second, and third active regions comprises a primary surface lying on a (100) or (110) crystal plane and oriented substantially in a direction of form <110>.

* * * * *